United States Patent
Haug et al.

(10) Patent No.: US 12,195,330 B2
(45) Date of Patent: Jan. 14, 2025

(54) METHOD FOR PRODUCING A PLURALITY OF SENSOR DEVICES, AND SENSOR DEVICE

(71) Applicant: Robert Bosch GmbH, Stuttgart (DE)

(72) Inventors: Daniel Haug, Neuffen (DE); Michael Knauss, Pfullingen (DE); Sebastian Schuler-Watkins, Herrenberg (DE); Stefan Pinter, Reutlingen (DE); Tobias Henn, Stuttgart (DE); Raschid Baraki, Reutlingen (DE)

(73) Assignee: ROBERT BOSCH GMBH, Stuttgart (DE)

( * ) Notice: Subject to any disclaimer, the term of this patent is extended or adjusted under 35 U.S.C. 154(b) by 641 days.

(21) Appl. No.: 17/299,214

(22) PCT Filed: Jan. 24, 2020

(86) PCT No.: PCT/EP2020/051791
§ 371 (c)(1),
(2) Date: Jun. 2, 2021

(87) PCT Pub. No.: WO2020/156955
PCT Pub. Date: Aug. 6, 2020

(65) Prior Publication Data
US 2022/0041436 A1 Feb. 10, 2022

(30) Foreign Application Priority Data
Jan. 31, 2019 (DE) .......................... 102019201228.0

(51) Int. Cl.
*B81C 1/00* (2006.01)

(52) U.S. Cl.
CPC ...... *B81C 1/00214* (2013.01); *B81C 1/00309* (2013.01); *B81C 1/00873* (2013.01);
(Continued)

(58) Field of Classification Search
CPC ....... B81C 1/00–00992; B81C 2203/00–0785; H01L 25/10–13; H01L 25/165
See application file for complete search history.

(56) References Cited

U.S. PATENT DOCUMENTS

| 6,062,461 A | 5/2000 | Sparks et al. |
| 6,266,197 B1 * | 7/2001 | Glenn .................. G01J 5/0875 359/821 |

(Continued)

FOREIGN PATENT DOCUMENTS

| CN | 101369543 A * | 2/2009 | ....... H01L 27/14618 |
| CN | 101665230 A * | 3/2010 | ........... B81B 7/0061 |

(Continued)

OTHER PUBLICATIONS

Machine translation, Ching, Chinese Pat. Pub. No. CN-107290096-A, translation date: Sep. 16, 2023, Clarivate Analytics, all pages. (Year: 2023).*

(Continued)

Primary Examiner — Victoria K. Hall
(74) Attorney, Agent, or Firm — NORTON ROSE FULBRIGHT US LLP; Gerard A. Messina

(57) ABSTRACT

A method for producing a plurality of sensor devices. The method includes: furnishing a substrate having contact points in a plurality of predetermined regions for sensor chips; disposing the sensor chips in the predetermined regions on the substrate, and electrically contacting the sensor chips to the contact points; attaching a frame structure with an adhesive material on the substrate and between the sensor chips, the frame structure proceeding laterally around the sensor chips, the frame structure extending, after attachment, vertically beyond the sensor chips and forming a respective cavity for at least one of the sensor chips, and a membrane spanning at least one of the cavities for the sensor chips so as to cover it; and singulating the substrate, (Continued)

or the frame structure and the substrate, around the respective cavities into several sensor devices.

14 Claims, 10 Drawing Sheets

(52) U.S. Cl.
CPC .............. *B81C 2203/0127* (2013.01); *B81C 2203/0163* (2013.01); *B81C 2203/032* (2013.01)

(56) References Cited

U.S. PATENT DOCUMENTS

| | | | |
|---|---|---|---|
| 6,326,228 B1 | 12/2001 | Hughes et al. | |
| 8,617,934 B1* | 12/2013 | Minervini | B81C 1/00333 29/609.1 |
| 8,828,807 B1* | 9/2014 | Wachter | H01L 23/48 257/E23.128 |
| 2002/0102004 A1* | 8/2002 | Minervini | H04R 19/016 381/174 |
| 2004/0038442 A1* | 2/2004 | Kinsman | H01L 27/14618 257/E31.117 |
| 2004/0043540 A1* | 3/2004 | Kinsman | H01L 27/14634 257/E31.117 |
| 2005/0017313 A1* | 1/2005 | Wan | B81C 1/00095 257/E29.323 |
| 2005/0057883 A1* | 3/2005 | Bolken | H01L 21/50 361/301.3 |
| 2005/0173811 A1* | 8/2005 | Kinsman | H01L 27/14618 257/784 |
| 2006/0186492 A1* | 8/2006 | Boettiger | H01L 27/14601 257/431 |
| 2008/0150064 A1* | 6/2008 | Zimmerman | H01L 23/49861 257/676 |
| 2009/0001553 A1* | 1/2009 | Pahl | B81B 7/0064 438/126 |
| 2009/0127638 A1* | 5/2009 | Kilger | G01L 19/141 438/51 |
| 2009/0148983 A1* | 6/2009 | Scheid | G01P 15/0802 438/460 |
| 2010/0320588 A1* | 12/2010 | Dahilig | H01L 23/562 257/E23.101 |
| 2011/0241197 A1* | 10/2011 | Theuss | H01L 24/97 257/E23.116 |
| 2011/0274299 A1* | 11/2011 | Shaw | B81B 7/0064 381/174 |
| 2013/0221455 A1* | 8/2013 | Manack | G01J 5/12 257/431 |
| 2013/0285167 A1* | 10/2013 | Otte | G01L 19/141 257/415 |
| 2014/0146509 A1* | 5/2014 | Hooper | B81B 7/0038 156/60 |
| 2014/0210019 A1* | 7/2014 | Nasiri | B81C 1/0023 438/51 |
| 2014/0291785 A1* | 10/2014 | Kasai | B81B 7/0061 257/416 |
| 2014/0346623 A1* | 11/2014 | Elian | H01L 29/84 438/51 |
| 2015/0054099 A1* | 2/2015 | Yow | H01L 23/49575 438/51 |
| 2015/0221572 A1* | 8/2015 | Chan | H01L 23/3107 257/734 |
| 2015/0270206 A1* | 9/2015 | Lo | G01L 19/147 438/51 |
| 2015/0285702 A1* | 10/2015 | Lo | H01L 25/041 73/754 |
| 2016/0130136 A1* | 5/2016 | Singh | H01L 23/29 264/272.17 |
| 2016/0141440 A1* | 5/2016 | Chun | H01L 31/18 257/82 |
| 2017/0207208 A1* | 7/2017 | Chen | H01L 23/3114 |
| 2017/0365632 A1* | 12/2017 | Tu | H01L 31/0203 |
| 2018/0138102 A1 | 5/2018 | Pan et al. | |
| 2018/0148322 A1* | 5/2018 | Maier | B81C 1/00301 |
| 2019/0023561 A1* | 1/2019 | Chan | B81B 7/0035 |
| 2020/0006174 A1* | 1/2020 | Geissler | H01L 21/6835 |
| 2020/0053483 A1* | 2/2020 | Theuss | H04R 31/003 |

FOREIGN PATENT DOCUMENTS

| | | | | |
|---|---|---|---|---|
| CN | 102683223 A | * | 9/2012 | ............. H01L 21/50 |
| CN | 102810488 A | * | 12/2012 | ......... G01L 19/0627 |
| CN | 104458101 A | * | 3/2015 | ........... B81B 7/0029 |
| CN | 104627945 A | * | 5/2015 | ........... B81B 7/0029 |
| CN | 205301225 U | * | 6/2016 | ......... G01N 33/0009 |
| CN | 106029554 A | | 10/2016 | |
| CN | 106458575 A | * | 2/2017 | .............. B81B 7/02 |
| CN | 107026154 A | | 8/2017 | |
| CN | 107265389 A | | 10/2017 | |
| CN | 107290096 A | * | 10/2017 | ........... G01L 17/005 |
| CN | 109642842 A | * | 4/2019 | ........... B81B 3/0051 |
| DE | 10204458 A1 | | 8/2003 | |
| EP | 10204458 A1 | | 8/2003 | |
| WO | WO-03067241 A2 | * | 8/2003 | ............. G01N 27/12 |
| WO | WO-2015169615 A1 | * | 11/2015 | .............. B81B 7/02 |
| WO | WO-2017163926 A1 | * | 9/2017 | ........... H01L 21/768 |

OTHER PUBLICATIONS

Machine translation, Miyazawa, WIPO Pat. Pub. No. WO-2017163926-A1, translation date: Sep. 16, 2023, Clarivate Analytics, all pages. (Year: 2023).*
Machine translation, Pahl, WIPO Pat. Pub. No. WO-2015169615-A1, translation date: Sep. 16, 2023, Clarivate Analytics, all pages. (Year: 2023).*
Machine translation, Li, Chinese Pat. Pub. No. CN-101665230-A, translation date: Sep. 16, 2023, Clarivate Analytics, all pages. (Year: 2023).*
Machine translation, Tsai, Chinese Pat. Pub. No. CN-106458575-A, translation date: Sep. 16, 2023, Clarivate Analytics, all pages. (Year: 2023).*
Machine translation, Braun, Chinese Pat. Pub. No. CN-104627945-A, translation date: Sep. 16, 2023, Clarivate Analytics, all pages. (Year: 2023).*
Machine translation, Luo, Chinese Pat. Pub. No. CN-104458101-A, translation date: Sep. 16, 2023, Clarivate Analytics, all pages. (Year: 2023).*
Machine translation, Lo, Chinese Pat. Pub. No. CN-102810488-A, translation date: Sep. 16, 2023, Clarivate Analytics, all pages. (Year: 2023).*
Machine translation, Takahashi, Chinese Pat. Pub. No. CN-102683223-A, translation date: Sep. 16, 2023, Clarivate Analytics, all pages. (Year: 2023).*
Machine translation, Peng, Chinese Pat. Pub. No. CN-101369543-A, translation date: Sep. 16, 2023, Clarivate Analytics, all pages. (Year: 2023).*
Machine translation, Jin, Chinese Pat. Pub. No. CN-205301225-U, translation date: Sep. 16, 2023, Clarivate Analytics, all pages. (Year: 2023).*
Machine translation, Wade, Chinese Pat. Pub. No. CN-109642842-A, translation date: Sep. 16, 2023, Clarivate Analytics, all pages. (Year: 2023).*
Machine translation, Raible, WIPO Pat. Pub. No. WO-03067241-A2, translation date: Sep. 12, 2023, Clarivate Analytics, all pages (Year: 2023).*
Translation, Written Opinion of the International Searching Authority, International Searching Authority, International application No. PCT/EP2020/051791, May 13, 2020, all pages. (Year: 2020).*
Translation, International Search Report, International Searching Authority, International application No. PCT/EP2020/051791, May 13, 2020, all pages. (Year: 2020).*
International Search Report for PCT/EP2020/051791, Issued May 13, 2020.

* cited by examiner

METHOD FOR PRODUCING A PLURALITY OF SENSOR DEVICES, AND SENSOR DEVICE

FIELD

The present invention relates to a method for producing a plurality of sensor devices, and to a sensor device.

BACKGROUND INFORMATION

In sensors that are configured to measure environmental parameters such as pressure or humidity, or to determine gases, direct contact with their environment is usually necessary. A requirement nevertheless exists for protecting the sensors from environmental factors such as dust or water, for example when the sensors are used in electronic devices such as mobile telephones or drones. Protection, but also the possibility of environmental access, can be achieved by closing off the media access of the sensor by way of a membrane that is impenetrable by dust and water but is permeable to air and water vapor. An example thereof is microporous membranes made of expanded polytetrafluoroethylene (ePTFE). These membranes are commercially obtainable, e.g., Gore-Tex of W. L. Gore & Associates, Inc.

The membrane is usually prefabricated at the size necessary for the sensor and is attached for each sensor, individually in succession in each case, either on the sensor or in advance on the cover; in usual methods, the cover itself can be attached serially for each individual sensor on the substrate (or substrate strip) of the sensor.

U.S. Patent Application Publication No. US 2014/346623 A1 describes a sensor having a membrane above a cavity, in which the membrane is configured as a flexible membrane. The pertinent method is suitable for producing multiple sensors.

SUMMARY

The present invention provides a method for producing a plurality of sensor devices, and a sensor device.

Preferred refinements of the present invention are disclosed herein.

In accordance with the present invention, a method for producing a plurality of sensor devices and a sensor device are provided. In accordance with an example embodiment of the present invention, a sensor chip is capable of being disposed by way of a frame structure in a cavity and of being covered by a membrane or covering device, the sensor chip being capable of being shielded for the most part from environmental influences, but small influences, such as pressure fluctuations, nevertheless being able to penetrate into the cavity through a hole or a membrane. A method in accordance with an example embodiment of the present invention is furthermore notable for simultaneous and parallel production of a plurality of sensor devices. The frame structure can be mounted in prefabricated fashion or can be produced on a substrate of the sensor device.

According to an example embodiment of the present invention, in the method for producing a plurality of sensor devices: a substrate, having contact points in a plurality of predetermined regions for sensor chips, is furnished; the sensor chips are disposed in the predetermined regions on the substrate, and the sensor chips are electrically contacted to the contact points; a frame structure is attached with an adhesive material on the substrate and between the sensor chips, the frame structure proceeding laterally around the sensor chips, the frame structure extending, after attachment, vertically beyond the sensor chips and forming a respective cavity for at least one of the sensor chips, and a membrane spanning at least one of the cavities for the sensor chips so as to cover it; and the substrate or the frame structure and the substrate are singulated, around the respective cavities, into several sensor devices.

The adhesive material can encompass an electrically conductive adhesive material.

A predetermined region on the substrate is provided at least for one sensor chip, around which the cavity of the frame structure is stamped or disposed, and encompasses contact points for those sensor chips. A plurality of such predetermined regions can advantageously be present on the substrate in an arbitrary or determined pattern. The membrane advantageously can completely span and completely cover the cavities. Singulation can be accomplished around the predetermined regions and thereby form individual sensor devices. In the context of singulation, depending on the shape of the frame structure a vertical singulation line can extend through the frame structure, or can relate only to the substrate if the frame structure, constituting a closed frame, is located inside the singulation line of the relevant (predetermined) region. Attachment of the frame structure can be accomplished in such a way that a frame that has been prefabricated, for instance by injection molding ("mold frame"), is attached onto the substrate, or the frame is configured directly on the substrate and represents a continuously connected structure or individual separated structures each constituting a cavity.

The membrane can advantageously be laminated (or laminated on) and inflexible, in other words substantially solid. The membrane, constituting a laminate having at least one stable supporting structure, for instance the edges of the cavity or separate support structures under the membrane surface, or having a cover above the cavity constituting a support structure having openings. The membrane can be air-permeable for that purpose.

In accordance with a preferred embodiment of the method in of the present invention, the electrically conductive adhesive material is attached to the substrate and between the predetermined regions for the sensor chips, and the frame structure is disposed on the adhesive material.

In accordance with a preferred embodiment of the method of the present invention, a carrier cover is disposed on the frame structure and so as to at least partly span the cavities, and the membrane is disposed on the carrier cover, the carrier cover encompassing an orifice above at least one of the cavities.

In accordance with a preferred embodiment of the method of with the present invention, singulation is accomplished by mechanical sawing or by laser ablation.

In accordance with a preferred embodiment of the method of the present invention, the membrane is laminated onto the carrier cover.

In accordance with a preferred embodiment of the method, the frame structure is disposed as a prefabricated component and in one piece on the substrate.

According to an example embodiment of the present invention, in the method for producing a plurality of sensor devices: a covering device that spans a holding frame is furnished; a frame structure is attached or stamped onto the covering device, or a frame structure that describes predetermined regions for sensor chips and that surrounds the predetermined regions as a respective cavity, is stamped out of the covering device; a substrate having sensor chips disposed thereon is furnished, a disposition of the sensor chips corresponding to the cavities of the frame structure; the substrate is disposed on the frame structure in such a way that at least one sensor chip is encompassed by one of the cavities, the substrate being adhesively bonded to the frame structure; and the substrate, or the frame structure and the substrate, is singulated around the respective cavities into several sensor devices.

The covering device can encompass a cover layer or a membrane, the membrane being notable for microscopic holes through which minor environmental influences such as moisture or pressure can be conveyed. A cover layer can advantageously be insulating in stable fashion with respect to such environmental influences.

The covering device can encompass a metallic or metal foil or a membrane structure, for instance a screen fabric, a perforated screen, a (multi-stage) stencil made of metal or plastic, or a microporous membrane made, for example, of expanded polytetrafluoroethylene (ePTFE). The frame structure can be disposed on the covering device in such a way that after attachment, the frame structure describes the predetermined regions.

Corresponding membranes can be attached onto a metal cover housing of sensors. The membrane can usually be mounted on a metal cover housing on the one hand using a structured adhesive film of appropriate size ("standard die attach equipment") which can be placed on the cover; or the membrane can be fastened with a liquid adhesive previously applied on the cover or applied on the cover from inside, advantageously already during production.

In accordance with a preferred embodiment of the method of the present invention, before singulation a reinforcing tape is furnished on a support, and the frame structure having the covering device is disposed on the reinforcing tape, and singulation is accomplished on the reinforcing tape and on the support, the sensor devices being detached from the reinforcing tape after singulation.

The reinforcing tape can represent temporary protection of the interior of the cavity during singulation and can be attached, preferably laminated, onto an outer side of the covering device. The reinforcing tape can encompass a so-called "blue tape."

Alternatively, the reinforcing tape can also be first applied onto the covering device (back side) and then applied onto a support, for instance can also span a dedicated holding frame.

In accordance with a preferred embodiment of the method of the present invention, the frame structure is shaped directly on the covering device by way of an injection molding method.

In accordance with a preferred embodiment of the method of the present invention, the frame structure is disposed as a prefabricated component on the covering device/membrane.

In accordance with a preferred embodiment of the method of the present invention, the frame structure is produced on the covering device by way of a lithography method.

In accordance with a preferred embodiment of the method of the present invention, the frame structure also extends at least locally from side walls of the cavities into an inner region thereof, where it at least partly covers or fills the covering device.

In accordance with a preferred embodiment of the method of the present invention, the frame structure is shaped out of the covering device and at least locally covers the cavity, and constitutes oblique side walls of the cavity.

According to an example embodiment of the present invention, the sensor device encompasses: a substrate having contact points and at least one sensor chip contacted thereto; a frame structure on the substrate which forms a cavity for the sensor chip and extends from the substrate vertically beyond the sensor chip; and a covering device that is disposed on the frame structure and so as to at least partly span the cavity.

In accordance with a preferred embodiment of the sensor device of the present invention, the latter encompasses an electrically conductive layer that is disposed in the interior of the cavity and extends over the frame structure and over the covering device.

In accordance with a preferred embodiment of the sensor device of the present invention, the frame structure is produced from an injection-molded part and the covering device encompasses a microporous membrane.

The membrane can encompass, for example, a microporous membrane made of expanded polytetrafluoroethylene (ePTFE). These membranes are commercially obtainable, for example Gore-Tex of W. L. Gore & Associates, Inc.

The sensor devices can encompass, for example, pressure sensors, gas sensors, or moisture sensors.

Further features and advantages of embodiments of the present invention are evident from the description below with reference to the figures.

BRIEF DESCRIPTION OF THE DRAWINGS

The present invention will be explained in further detail below on the basis of the exemplifying embodiments indicated in the schematic Figures.

FIGS. 2a1-c2 are schematic side views and plan views of a covering device in the context of attachment of a frame structure and in the context of singulation, in accordance with several exemplifying embodiments of the present invention.

In the Figures, identical reference characters refer to identical or functionally identical elements.

DETAILED DESCRIPTION OF EXAMPLE EMBODIMENTS

FIGS. 1*a-d* are schematic side views of a covering device in the context of attachment of a frame structure, in accordance with several exemplifying embodiments of the present invention.

Figure 1A:
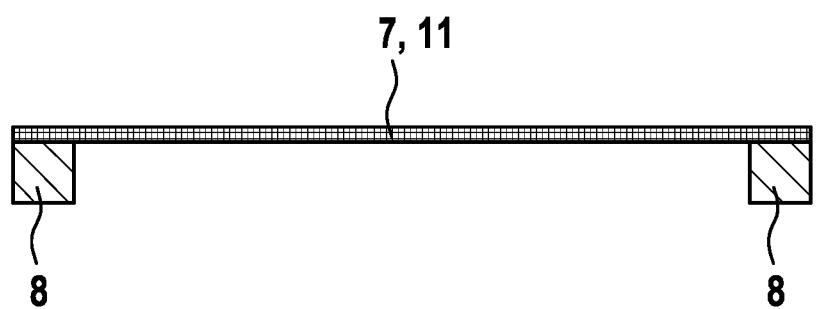
FIGS. 1a-d are schematic side views of a covering device in the context of attachment of a frame structure, in accordance with several exemplifying embodiments of the present invention.

In FIG. 1*a*, the side view shows a cross section of covering device 11, which can be embodied e.g. as a cover layer 11 or as a membrane 7, and which is disposed above a holding frame 8 and spans the latter. Holding frame 8 can be rectangular (in plan view). Because covering device 11 (7) can span holding frame 8, simplified processing can thereby be achieved.

The covering device can encompass a metal or plastic wire fabric such as that usually utilized for screen printing. The covering device can be flexible and can advantageously also be connected to distorted substrates, but can also easily be attached onto a plane.

The covering device can encompass a wire fabric, for example made of warp and weft thread systems, and in the case of metal threads can optionally be reduced in thickness by calendering. The warp and weft threads can be immobilized at their intersection points by plating; by calendering at elevated temperature, a thickness of the plastic wire fabric can be reduced and they can be immobilized with respect to one another, or fused to one another, at the intersection points. An open screen area (fineness) can be defined by the wire diameter and by the mesh count per unit length and by the calendering process. Screens for screen printing can be equipped with a photosensitive layer into which openings can be introduced in a lithographic process (as in FIG. 1*d*). On the other hand, however, a covering device of this kind can also encompass a thin metal or plastic film into which structures (depressions or also passthrough holes) can be etched, stamped, or introduced by a laser. Depending on the thickness of the membrane (covering device), a diameter of such openings can be less than 10 μm. The covering device can, however, also encompass a microporous membrane.

Figure 1B:
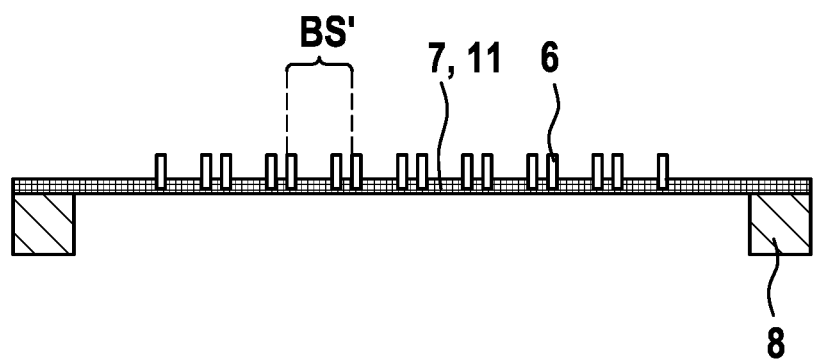

In FIG. 1*b* a frame structure 6 is then attached onto covering device 7, 11, for instance is produced by an injection-molding process on covering device 11, 7 in regions BS' predetermined therefor. Injection attachment allows frame structure 6 to be intimately connected to covering device 11, 7. The regions of frame structure 6 between the adjacent cavities K can be connected to one another or can represent individual cavities separated from one another. Frame structure 6 can be attached with high accuracy, which can also result in highly accurate housing dimensions, in particular for or after singulation.

Figure 1C:
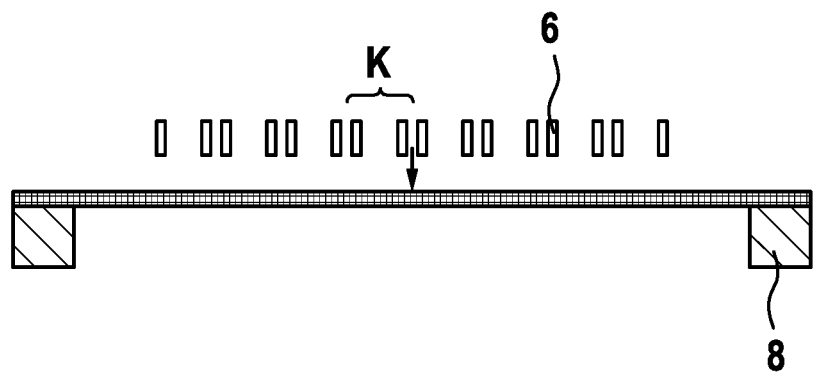

FIG. 1*c* shows an alternative method of attaching frame structure 6 onto the covering device; it can be attached as a prefabricated frame structure ("standard transfer molding"), for instance produced by injection molding and, after attachment, defining already predetermined regions BS for the sensor chips. After frame structure 6 has been transferred onto covering device 11, 7, frame structure 6 can be intimately connected to the covering device, for example, by adhesive bonding or lamination.

Figure 1D:
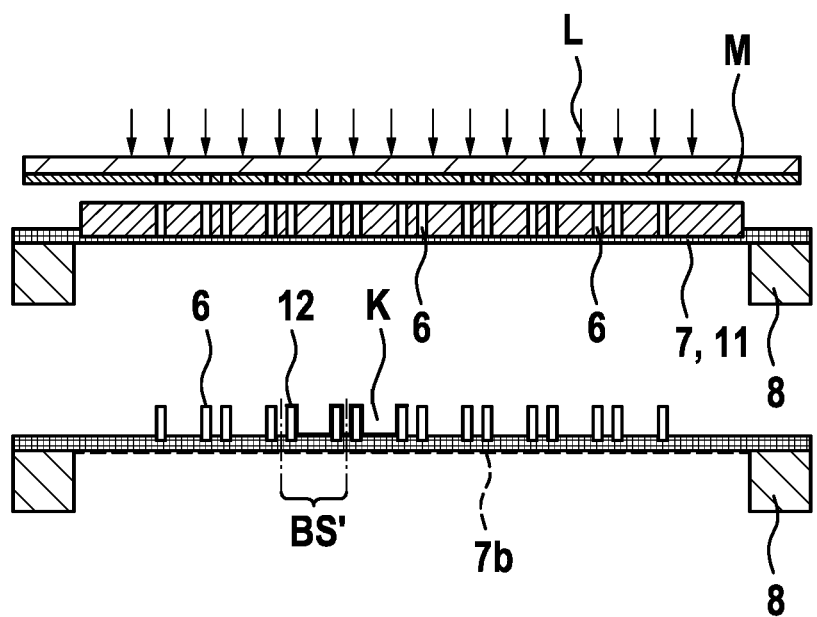

FIG. 1*d* in turn shows an alternative method for attaching frame structure 6 onto covering device 11, 7, in which a photolithographic method can be utilized. Firstly a photoresist can be applied onto covering device 11, 7 and can then be exposed by structuring so as thereby to produce the frame structure using a subsequent etching process. This can be accomplished by exposure L using a mask M. A photolithographic method allows the generation of particularly thin cavity side walls, which can define a predetermined region BS'; this can improve utilization of an available space on the covering device or substrate (several sensor devices on the substrate and thus a cost saving).

An electrically conductive layer 12 can then be applied over covering device 11 (7) and over frame structure 6 and its side walls; it can also additionally be applied on the outer wall of the cavity (of the frame structure between the predetermined regions). This electrically conductive layer 12 can represent electromagnetic shielding for cavities K. This layer 12 can encompass a metal and can be disposed on a front side and/or back side of the covering device. Coating using layer 12 is shown only in FIG. 1*d*, but it can be accomplished in all the alternatives of FIG. 1. The shielding can be effective against externally acting electromagnetic fields (EMC). Electrically conductive layer 12 can be applied, for example, by sputtering or vapor-coating. Layer 12 can be connected via a conductive adhesive to contacts provided therefor on the substrate (circuit board).

The photoresist can encompass one or several light-sensitive layers and, for example, can be laminated on. The subsequent height of the side walls of cavity K can be determined by way of the thickness of the photoresist. The photoresist can encompass, for example, SU-8 (MicroChem Corp.) or SUEX (DJ Microlaminates, Inc.). SU-8 can be applied as a liquid lacquer, and SUEX can constitute a so-called solid resist and can be laminated on as a film. Exposure can be effected using UV light. Frame structures 6 having a high aspect ratio of wall thickness to wall height can be produced, so that narrow and closely spaced walls of the cavities and adjacent cavities can be produced. The tight spacing of the walls of adjacent cavities advantageously makes possible small housing dimensions and a high packing density of the sensor devices, while at the same time close geometrical and positional tolerances on the covering device are possible, so that a cost advantage and an advantage in terms of further processing can be achievable. The covering device can furthermore encompass small holes that can be covered with membrane 7*b*.

Frame structure 6 of FIGS. 1*b* to 1*d* can advantageously be stamped as a vertical wall and can form side walls of cavities K.

Frame structure 6 can encompass a usual screen-printing mask, a metal stencil, or a convex metal mask. It is furthermore possible for alignment pins, for example pegs (not shown) likewise made of the material of frame structure 6, to be stamped on covering device 11, 7, which pins, upon attachment onto a substrate having sensor chips, can be positioned in alignment holes therein in order to allow the substrate to be immobilized at the point provided therefor. As shown in FIG. 1*d* (bottom), a microporous membrane 7*b*, made for example of expanded polytetrafluoroethylene (ePTFE), can be attached onto the back side of the covering device in order to protect the electronic sensor chips in the cavity from dirt and water. A pneumatic connection (including a lateral one) to the outside world can exist via the microporous membrane, so that the external air pressure can correspond to the pressure in the interior of the housing, while at the same time penetration of water into the cavity can be prevented.

FIGS. 2a1 to 2c2 are schematic side views and plan views of a covering device in the context of attachment of a frame structure and in the context of singulation, in accordance with several exemplifying embodiments of the present invention. FIGS. 2a1 to 2c2 show different embodiments.

Figure 2A:
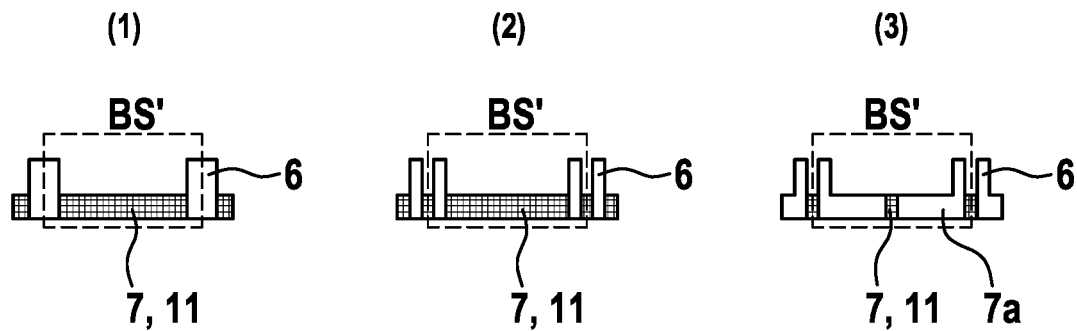

FIGS. a1, a2, and a3 are cross sections through covering device 11, 7; frame structure 6 is introduced into the covering device, can be introduced into the screen fabric, perforated screen, or the stencil, and can also extend partly inside it as shown in FIG. 2A3. Frame structure 6 can constitute side walls of a cavity and can define a predetermined region BS'; in the context of singulation, singulation can occur vertically through frame structure 6 (FIG. 2a1), or frame structure 6 already encompasses an open space between two adjacent cavities and can be singulated only through the covering device (FIG. 2a2) in order to generate predetermined region BS' for the respective cavity. If singulation occurs only through covering device 11, 7, singulation can occur through less material and more quickly. FIG. 2a3 shows the latter case in a context in which the material of frame structure 6 additionally extends inside covering device 11 except for a small exposed area at the center of the covering layer between the side walls. In this exposed area the covering device forms a hole for communication with the environment, but only in the manner permitted by the covering device, for example only for pressure. The remaining region of the cavity can be shielded from the environment by the material of frame structure 6 above the cavity. An exchange, sufficient for measurement, with only some of the environmental influences, for instance pressure or liquid droplets, can nevertheless exist through the hole. The embodiment of FIG. 2a1 could also encompass a material of frame structure 6 inside the covering device over the cavity, as in FIG. 2a3. Carrier cover 7a can correspond to frame structure 6 and can also extend (via the cavity) into the inner region.

Figure 2B:
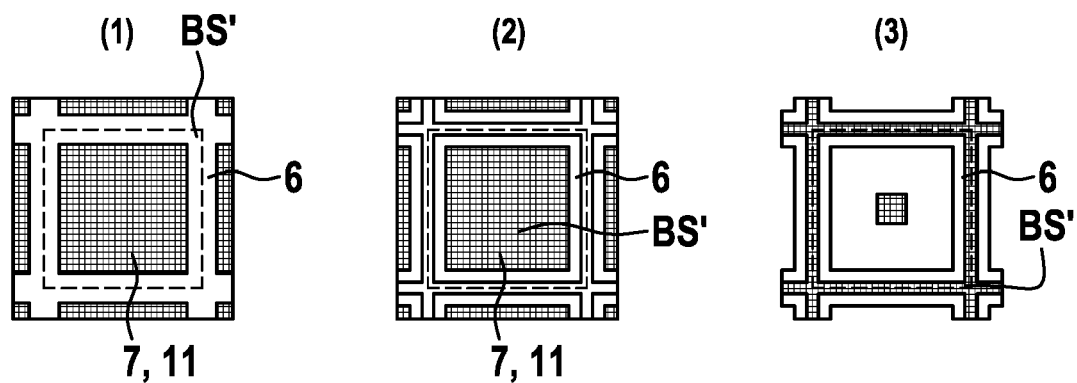

FIGS. 2b1 to 2b3 are plan views of the pertinent FIGS. 2a1 to 2a3 located above them, and show the lines for singulation into predetermined regions BS'. FIG. 2b3 shows, in the center region between the surrounding frame structure 6, the hole region of covering device 11, 7; the surrounding region can be covered from above by the covering device with frame structure.

Figure 2C:
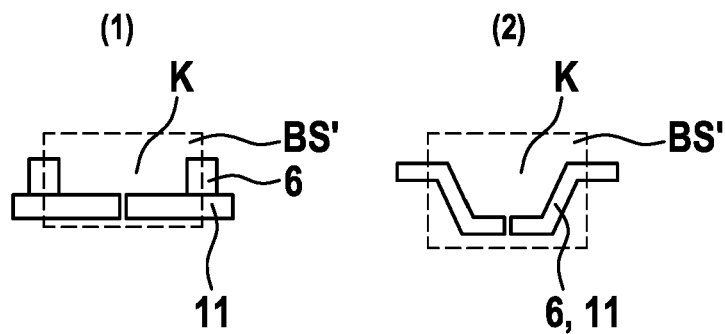

FIG. 2c1 is a side view of a covering device 11 that can encompass a metal foil or a metal having a small hole in the center region. Frame structure 6 can encompass as side walls once again a metal, for instance a metal structure that can extend vertically away from covering device 11. The side walls can be applied, for example laminated, onto the covering device as separate structures of a structured wall layer. Covering layer 11, 7 can itself also be structured for that purpose, and can encompass, for example, holes for environmental access. FIG. 2c2 is a side view in which covering device 11 encompasses a cavity that has been shaped in one piece out of the covering device and, for example, can encompass oblique cavity walls. A small hole can be introduced in the center region above the cavity. After corresponding singulation, in FIGS. 2c1 and 2c2 a cavity for a sensor device can once again be present. The oblique side walls can be produced by stamping from a metal foil. The covering device and frame structure (wall layer) can each also encompass membranes made, for instance, of metal or plastic, which each can be individually structured and can then be fitted together (FIG. 2c1). The covering device can also, for example, be rigid, in which context a nitrocellulose-containing material can be omitted.

Screens on frames for screen printing are commercially available with dimensions from approx. 300×300 mm to 2500×2700 mm. Corresponding systems for covering, coating, laminating, exposure and development, cleaning, and testing, for producing the structures on the fabric or screen surfaces provided with photosensitive coatings, are available from the same manufacturers.

The embodiments described in FIGS. 2a1 to 2c2 advantageously describe a housing cover and a housing wall in the form of the covering device and the side walls of the cavity as a combined unit. Because the covering device already exists after production, a separate or additional cover can be omitted.

Figure 3A:
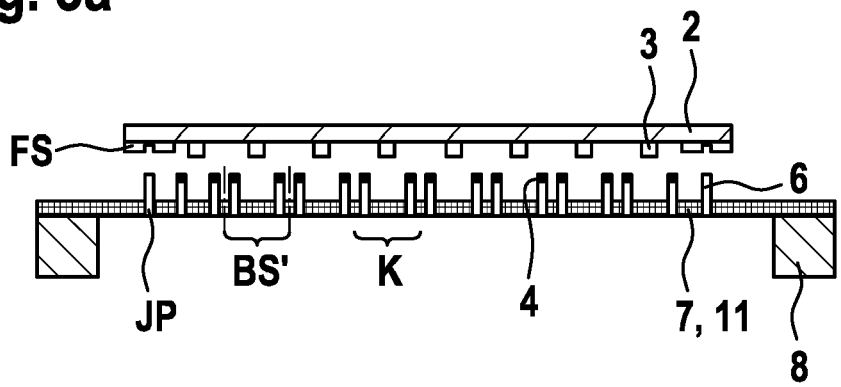
FIGS. 3a-c are schematic side views of a covering device in the context of attachment of a substrate having sensor chips, in accordance with an exemplifying embodiment of the present invention.
Figure 3B:
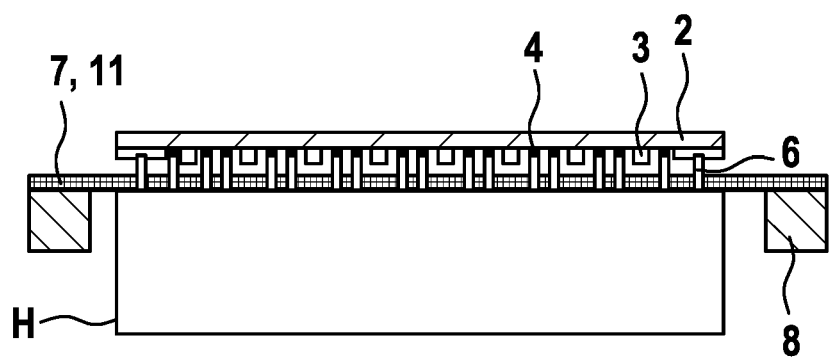
Figure 3C:
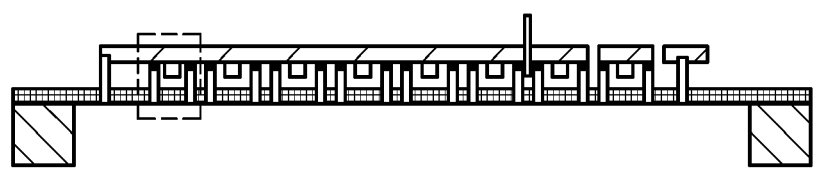

FIGS. 3a to 3c are schematic side views of a covering device in the context of attachment of a substrate having a sensor chip, in accordance with an exemplifying embodiment of the present invention.

A substrate having a plurality of covering devices is shown.

FIG. 3a is a side view of a covering device 11, 7 as depicted in FIG. 1, frame structure 6 being attached on covering device 11/membrane 7 and already forming, in predetermined regions BS', cavities K for sensor chips 3. An adhesive material 4, preferably an electrically conductive one, can be applied, for example by screen printing or by dispensing, onto a front side, facing away from covering device 11, of frame structure 6 (end face). This adhesive material can encompass a B-stage adhesive, in other words a pre-cured adhesive.

A substrate 2 having sensor chips 3 disposed thereon (in predetermined regions for the cavities) can be disposed on frame structure 6, so that sensor chips 3 penetrate into the cavities provided for them and substrate 2 can be adhesively bonded using adhesive material 4 in order to close off a respective sealed cavity K. Substrate 2 can be configured as a printed circuit board (PCB) and can already electrically contact sensor chips 3. Sensor chips 3 can encompass MEMS sensors, ASICs, or further forms of sensor chips, and can be attached and contacted by flip-chip mounting or wire bonding. Assembly pins which have mounts provided for alignment, on which no adhesive needs to be placed, can engage onto the edge regions of the frame structure. Mounts FS can be adhesively bonded onto substrate 2, for example as a ring, and can encompass orifices or depressions for alignment pins JP.

As shown in FIG. 3b, covering device 11, 7 can be placed on a flat surface, for example on a heating element H; after aligned placement of substrate 2 onto frame structure 6, the adhesive can be cured at elevated temperature and contact pressure. The contact pressure can be implemented either mechanically from the front side or also on the back side via vacuum suction (via the covering device), with the advantageous result that any distortions of the covering device and/or substrate 2 which may be present can be flattened out.

In a further step the cavities can be singulated into individual sensor devices, as shown in FIG. 3c. Because the sensor devices are a combined unit with the frame structure, simplified handling and positioning can be achieved along with high positioning accuracy, and simultaneous electrical contacting of even a plurality of components is possible; this can yield a savings of time and cost. The accuracy of MEMS sensor devices can be influenced by mechanical stresses in the housing (frame structure and cover or membrane). Any mechanical stresses present in the combined unit can be reduced, before electrical calibration of the sensor devices, merely by singulation (separation) of substrate 2. The combined unit (chip, cover, and housing) can nevertheless be kept together by the covering device.

Once adhesive material 4 has cured, final electrical measurement or calibration of sensor chip 3 in the combined unit can be accomplished; a plurality of sensor chips can be contacted simultaneously, which can yield parallelization for cost and time saving. The accuracy of MEMS sensors can also be influenced by mechanical stresses in the housing. Any mechanical stresses in the combined unit can advantageously already be reduced, before electrical calibration, by the separation of substrate 2. The combined nature of the sensor devices, and good contactability, can nevertheless advantageously be retained a priori as a result of the covering device.

Covering devices 11, 7 can be sufficiently large in their lateral extent that several substrates 2 having sensor chips 3 can be disposed next to one another.

Figure 4:
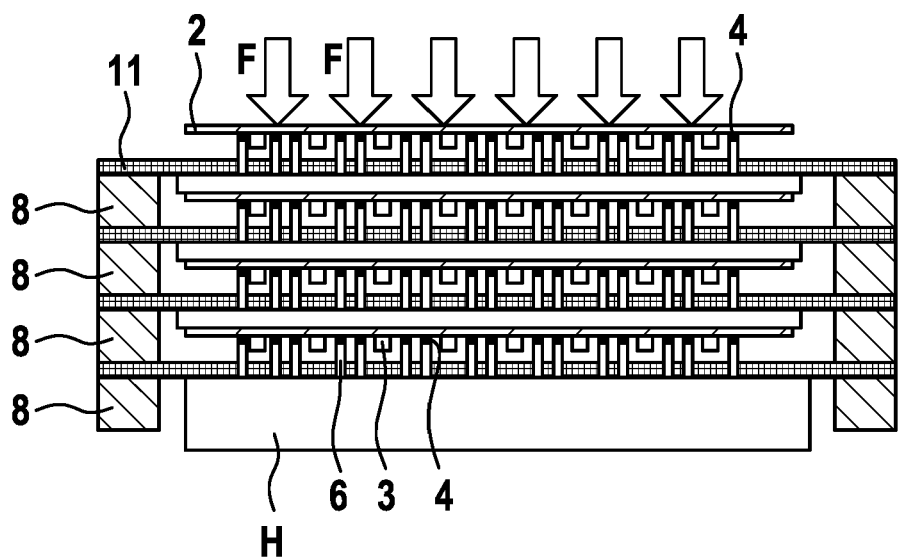
FIG. 4 is a schematic side view of several covering devices in the context of attachment of several substrates having sensor chips, in accordance with a further exemplifying embodiment of the present invention.

FIG. 4 is a schematic side view of several covering devices in the context of attachment of several substrates having sensor chips, in accordance with a further exemplifying embodiment of the present invention.

As shown in FIG. 4, adhesive material 4 can also be cured simultaneously with several covering devices 11, 7 and substrates 2 stacked one above another; several substrates 2 having sensor chips in cavities of cover devices can be stacked above heating element H, so that production costs can be decreased. A respective intermediate layer can advantageously be disposed between the stacked covering devices in order to protect the contact points of substrate 2. A force F can be exerted onto the stack from an upper side. Parallel curing of adhesive material 4 can thereby be accomplished.

Several substrates stacked one above another can form a stack of covering substrates and sensor substrates. FIG. 4 shows a batch process with respect to the joining process of FIG. 3, i.e. how the latter might look in a batch process (bundling process).

Figure 5:
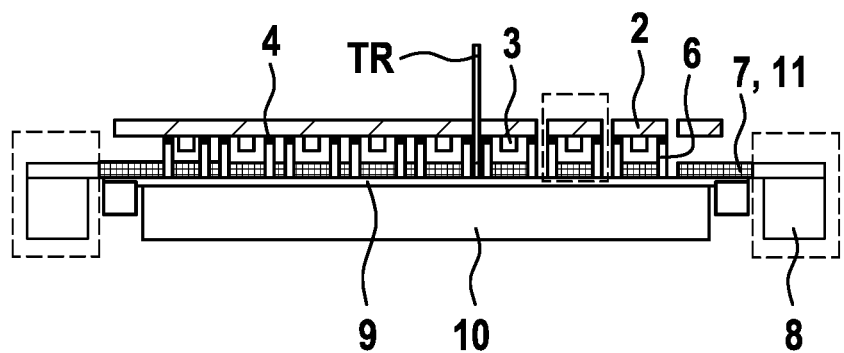
FIG. 5 is a schematic side view of a covering device in the context of singulation, in accordance with a further exemplifying embodiment of the present invention.

FIG. 5 is a schematic side view of a covering device in the context of singulation, in accordance with a further exemplifying embodiment of the present invention.

Before singulation, a reinforcing tape 9 can be furnished on a support 10, and frame structure 6 having the covering device can be attached onto support 10; reinforcing tape 9 can be applied onto a back side of covering device 11, 7 before placement on support 10, sensor devices 1 being detached from reinforcing tape 9 after singulation. The reinforcing tape can encompass a so-called "blue tape."

Fitting of a substrate with the covering device can therefore be accomplished.

Alternatively, the reinforcing tape can also first be applied onto support 10 and can also span a separate holding frame. Singulation can be effected using a separating device TR.

Singulation can be effected by way of standard saws having a diamond-embedded abrasive wheel, or also by way of a laser. Tape 9 can protect the back side of the covering device from dirt and water during singulation, and at the same time can be a carrier of the singulated sensor devices during further processing. The singulated sensor devices can be delivered on tape 9, with the frame, to a standard population system, and removed from tape 9 ("pick and place"). The singulated sensor devices can also be aligned with one another on tape 9 after complete singulation, and electrical calibration can then also occur in that state. A pneumatic connection to the housing interior (interior of the cavity) can exist thanks to the lateral gas permeability of a microporous membrane. Calibration or final measurement can occur before or after singulation.

Figure 6A:
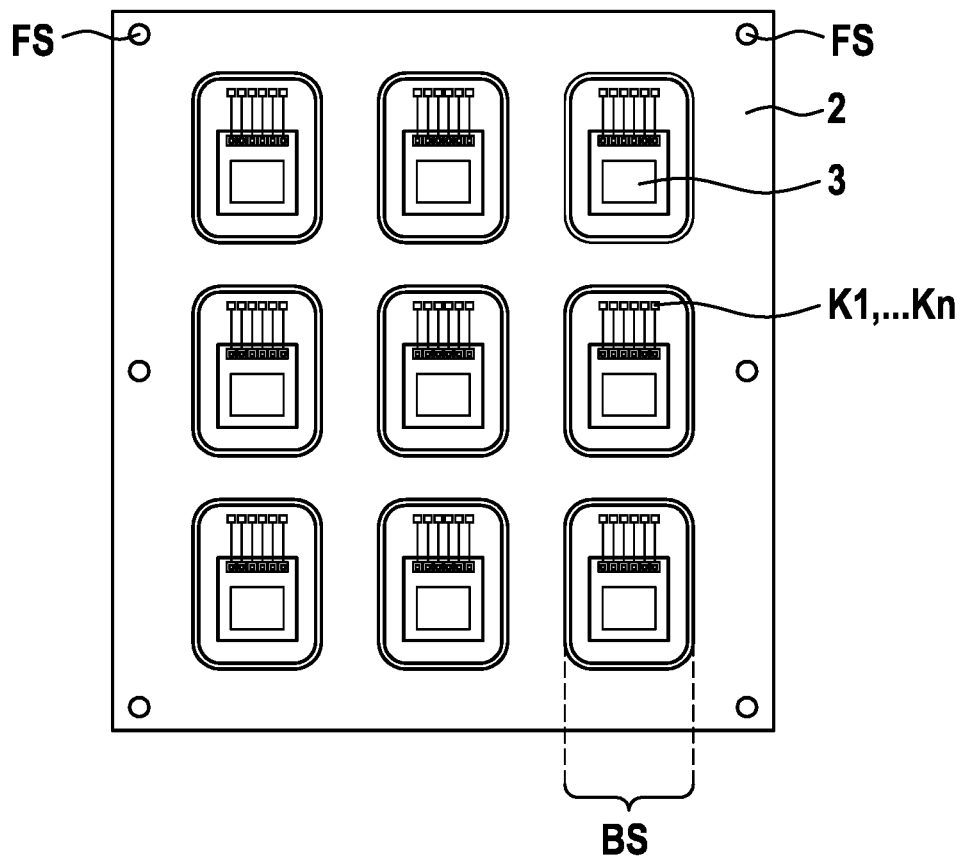
FIG. 6 is a schematic plan view and a side view of a substrate having sensor chips, in accordance with an exemplifying embodiment of the present invention.
Figure 6B:
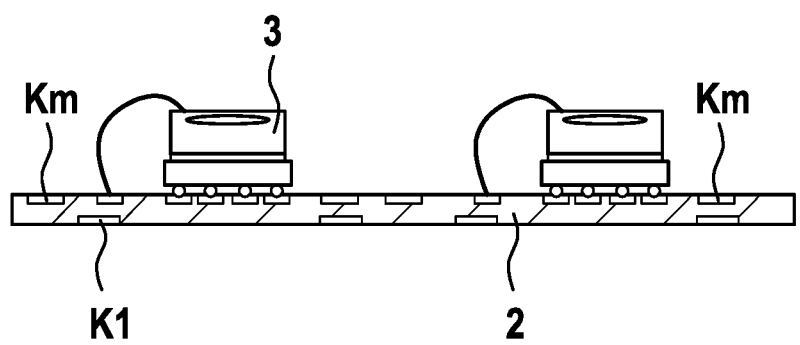

FIG. 6 is a schematic plan view and a side view of a substrate having sensor chips, in accordance with an exemplifying embodiment of the present invention.

Substrate 2 advantageously encompasses one or several predetermined regions BS for the placement of sensor chips 3. Image a is a plan view of substrate 2 having predetermined regions BS and contacts K1, . . . , Kn disposed therein, as well as several sockets for the sensor chips which can be disposed in predetermined regions BS. Image b is a side view of substrate 2 constituting a circuit board and of sensor chips 3 already disposed thereon in predetermined regions BS. The sensor chips can be disposed on substrate 2 as flip chips. Wire-bond contacting (wire-bond MEMS) is also possible. Any other desired configurations for sensors in, for instance, gas and moisture sensors or pressure sensors having a wire-bond ASIC (e.g. in an "open cavity package") can also be used in the context of the sensor devices. Substrate 2 can be a laminate substrate. Contacts K1, . . . , Kn can be contact fingers (e.g. C4 pads, bonding fingers for contacting the MEMS after wire-bonding) and/or measurement contacts (GND, shield tracks) for ground contacting of the subsequently attached frame structure. The contacts and ground contacts Km can be furnished (present) for each predetermined region and for each sensor chip 3.

Figure 7A:
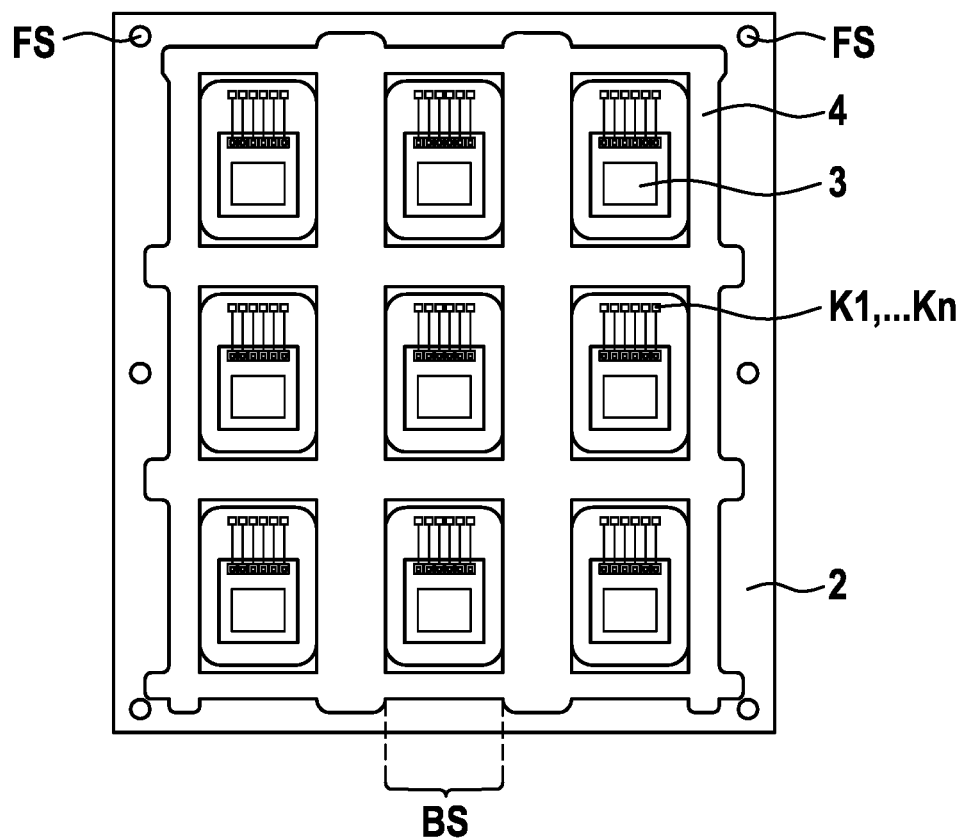
FIG. 7 is a schematic plan view and a side view of a substrate having sensor chips with an adhesive material, in accordance with an exemplifying embodiment of the present invention.
Figure 7B:
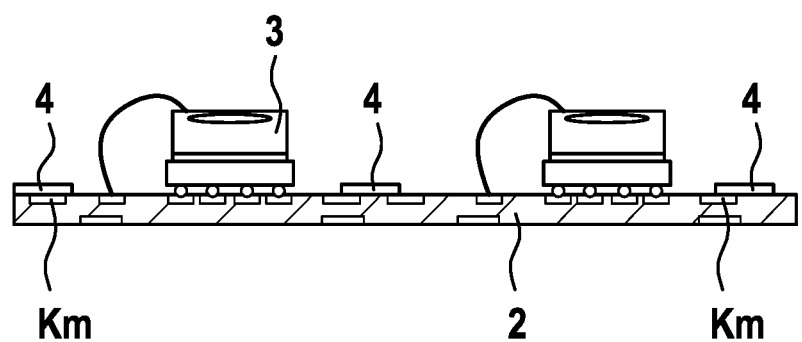

FIG. 7 is a schematic plan view and a side view of a substrate having sensor chips with an adhesive material, in accordance with an exemplifying embodiment of the present invention.

FIG. 7 shows the substrate after a possible next process step, in which context an advantageously electrically conductive adhesive material 4 ("frame attach epoxy") can be disposed on substrate 2 between predetermined regions BS (in plan view in image a and in side view in image b). This adhesive material 4 can be electrically connected to ground contacts Km, advantageously can overlap with them, which can be achieved by corresponding dispensing of the adhesive material. Optionally, a so-called B-stage epoxy can be used with which, after initial curing after the dispensing process, further deliquescence of the adhesive upon subsequent attachment of the frame structure ("mold frame attach process") can be prevented. The regions between the predetermined regions can advantageously be at least locally coincident with the sawing lines of the later frame structure.

Alternatively the adhesive material can already be applied onto frame structure 6 in the context of production thereof.

Figure 8A:
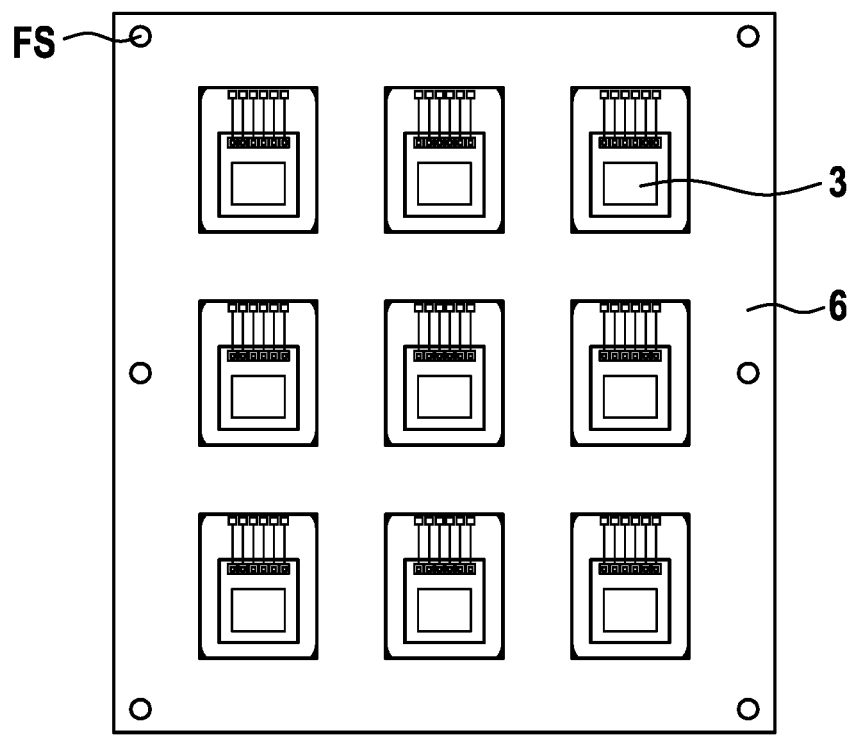
FIG. 8 is a schematic plan view and a side view of a substrate having sensor chips and a frame structure, in accordance with an exemplifying embodiment of the present invention.

FIG. 8 is a schematic plan view and a side view of a substrate having sensor chips and a frame structure, in accordance with an exemplifying embodiment of the present invention.

FIG. 8 shows substrate 2 after a possible next process step, a prefabricated frame structure 6 being attached to substrate 2, which structure can form cavities K in or around the predetermined regions and can represent vertical side walls of the cavities. Frame structure 6 can advantageously have, upon attachment to substrate 2, the same base outline as substrate 2. The predetermined regions can represent an internal subdivision of the substrate and of the frame structure. The subdivisions of the frame structure into cavities can be prefabricated on substrate 2 in accordance with unit indices of the sensor chip.

Frame structure 6 can be attached directly onto adhesive material 4 and can be contacted to ground contacts Km. The frame structure can be adhesively bonded onto substrate 2 after the completion of contacting processes, for instance die-bond and wire-bond processes (and possible further assembly processes, e.g., "underfill dispense," etc.). The frame structure can advantageously encompass only vertical side walls.

Figure 8B:
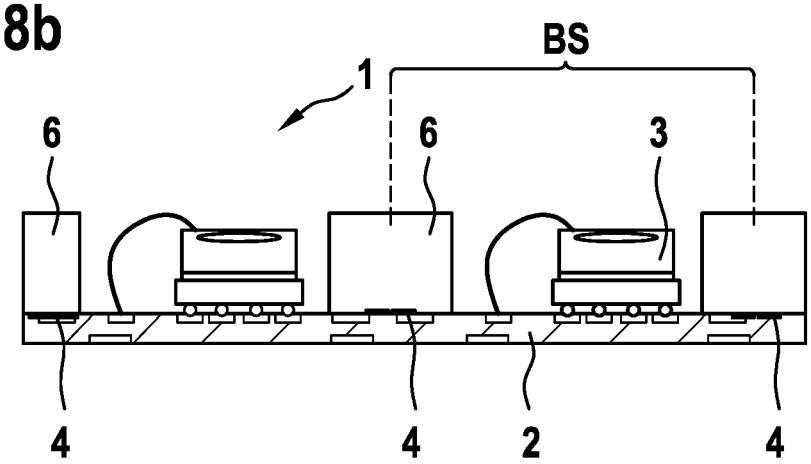

The frame structure can extend vertically beyond sensor chip 3, and advantageously can also protrude an additional height of a wire connection above sensor chip 3. The frame structure, advantageously produced by injection molding, can be produced elsewhere and can be attached integrally onto substrate 2, for instance as a mold frame. It can be designed in terms of its height in such a way that the height can correspond to the sum of a sensor chip height, a contact wire height, and a necessary safety margin for tolerance compensation. The frame structure can itself be conductive or can be conductively coated. Such coating can be effected, for example, by physical vapor deposition (PVD). Because sensor chips 3 at this point in time do not yet need to be covered by a package cover, an optical process check to ensure against contamination of the sensors, for example with frame attach adhesive, can then be effected. Frame structure 6 can form predetermined regions BS for sensor chips 3 (FIG. 8b).

In the context of production, the frame structure can have a symmetrical configuration (in plan view), so that warpage can advantageously be minimized. A single frame workpiece can consequently be used to cover an entire substrate having typical dimensions of approx. 100 mm×250 mm (maximum possible parallelization and optimum utilization of substrate area). An optical check of sensor chip 3 to ensure against contamination with adhesive material 4 used to bond on the frame can be made after the attachment of frame structure 6.

Each of FIGS. 6 to 8 shows alignment holes ("drill holes") for pins JP of a prefabricated frame structure, so that upon attachment, they can be attached at the position specified for them.

Figure 9A:
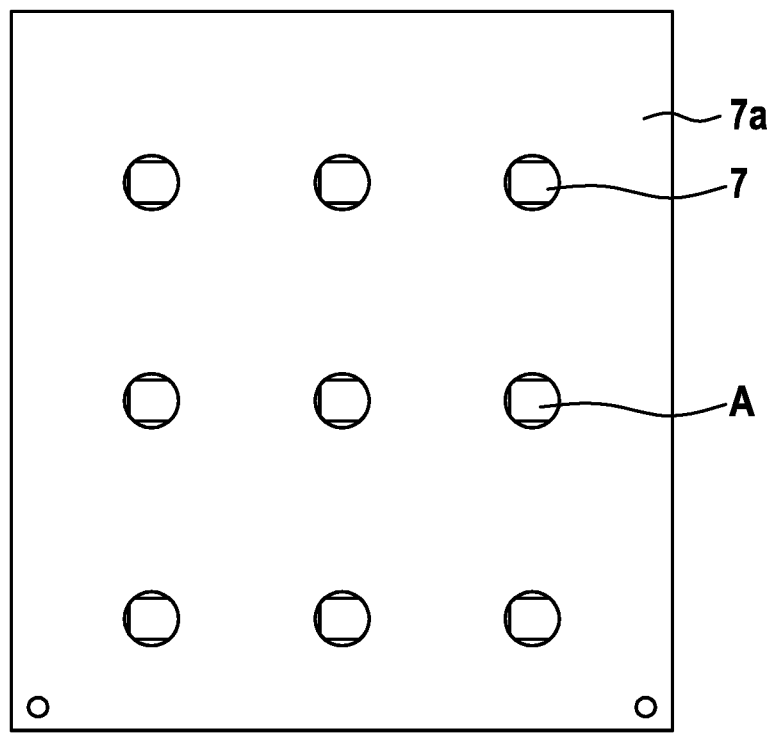
FIG. 9 is a schematic plan view and a side view of a substrate having sensor chips and a membrane, in accordance with an exemplifying embodiment of the present invention.
Figure 9B:
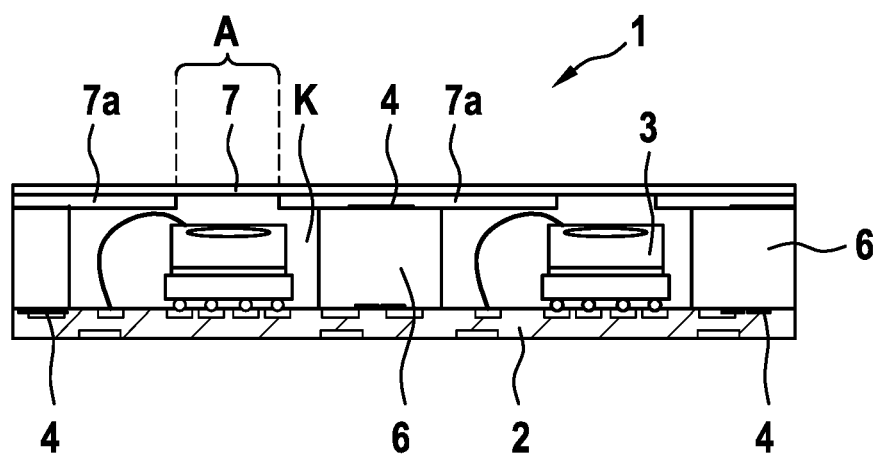

FIG. 9 is a schematic plan view and a side view of a substrate having sensor chips and a membrane, in accordance with an exemplifying embodiment of the present invention.

FIG. 9 shows the assemblage of FIG. 8 in a plan view in image a and in a side view in image b, after a possible next step following FIG. 8, a carrier cover 7a being disposed on frame structure 6 and being capable of partly spanning cavities K. A membrane 7, which can entirely span cavity K and can encompass the same base outline as the substrate, can also be disposed on carrier cover 7a. Carrier cover 7a (combination film) can encompass, in the context of a cavity K, an orifice A, advantageously round, advantageously above sensor chip 3, with the result that in this region, membrane 7 can create a partial media communication with the outside world. Membrane 7 can encompass, for example, an ePTFE. Carrier cover 7a can be fastened onto frame structure 6, for example, using an adhesive material 4. Carrier cover 7a can encompass a reinforcing tape ("carrier tape"). Adhesive material 4 can be electrically conductive and can be dispensed onto frame structure 6 ("membrane attach epoxy"). Orifices A can be pre-structured. The ePTFE membrane that is present can protect the sensor chip from the entry of dust and water.

The membrane can again be aligned with respect to frame structure 6 by way of alignment pins (not shown), so-called "pilot pins," and alignment holes in the membrane. The requirements in terms of placement accuracy in the context of membrane attachment are only moderate here (approx. +/−1.0 mm), since in terms of the functionality of the sensor chip all that can be guaranteed is that orifice A can overlap with the base outline of the respective corresponding sensor unit. The advantageously electrically conductive carrier cover can on the one hand furnish the necessary reinforcement of the ePTFE membrane in order to increase mechanical stability, and on the other hand can implement electromagnetic shielding (EMC shielding) of the cavity covering.

The carrier cover and the membrane can thus advantageously be attached in parallel over several cavities, which can decrease process costs for the production of a plurality of sensor devices and production costs for the carrier cover and membranes, in particular as compared with production of separate sensors. As compared with the separate sensor, the requirement in terms of positioning accuracy can be less, and processing speed can advantageously be increased. Individual part inspection for the position of each membrane can advantageously be omitted. A membrane and carrier cover over the cavity do not require separate covers over the cavity, so that the height of the overall component can be capable of being reduced; this can be advantageous for use in mobile telephones or other applications.

Alternatively, frame structure 6 can also encompass a partial piece that can extend on an upper side of the frame structure in a horizontal direction from the vertical side wall of the cavity into the cavity, and can partially brace carrier cover 7a from its underside while orifice A, conversely, can remain free. Mechanical stability of the membrane and of the carrier cover can thereby be increased. Frame structure 6 can encompass, in the horizontal extent, an interstice/cutout for any bond wires to the upper side of the chip or for the sensor chip itself, without thereby increasing a component height.

As an alternative to the production step described, the membrane and the carrier cover can already be disposed on frame structure 6 upon production thereof. A cost saving can result therefrom.

Figure 10:
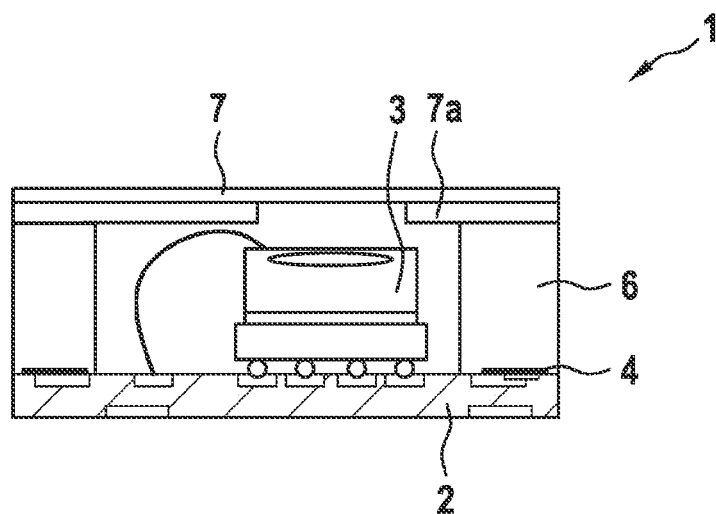
FIG. 10 is a schematic side view of a sensor device in accordance with an exemplifying embodiment of the present invention.

As an alternative to production in FIGS. 6 to 9, the frame structure can also be produced on the substrate, for example, using film mold methods, and the cavities can be equipped with sensor chips. A combination film (carrier cover) and membrane can likewise be adhesively bonded onto such a frame structure 6. FIG. 10 is a schematic side view of a sensor device in accordance with an exemplifying embodiment of the present invention.

After the cavities are covered in FIG. 9, singulation into individual sensor devices 1, as shown in FIG. 10, can occur. After, for example, lamination of membrane 7, the sensor devices can be singulated by, for example, mechanical sawing or by laser ablation, in which context the membrane, the carrier cover, the frame structure, and the substrate can be cut through; alternatively, only the substrate can also be cut through, if the structures present thereon extend only within the predetermined region. Upon singulation, the sensor chips can advantageously be protected by the membrane from the entry of particles, sawing water, and other contaminants. Only a microscopic opening through the membrane can be present.

Because frame structure 6 advantageously can form only the side walls of the cavity, delicate structures having thin wall thicknesses can be omitted in the context of production, since they do not need to constitute the cover; the minimum width of a beam in the frame can encompass approximately 700 μm (for instance, in the context of a double final wall thickness after singulation, as 200 μm for each side wall and with sawing lines 300 μm wide). The frame can thus be produced economically from a standard molding compound using transfer molding (no "LCP injection molding" needed).

With the cavity covered by the membrane, a sensor device can meet an IP68 requirement (no entry of water and dust).

Figure 11:
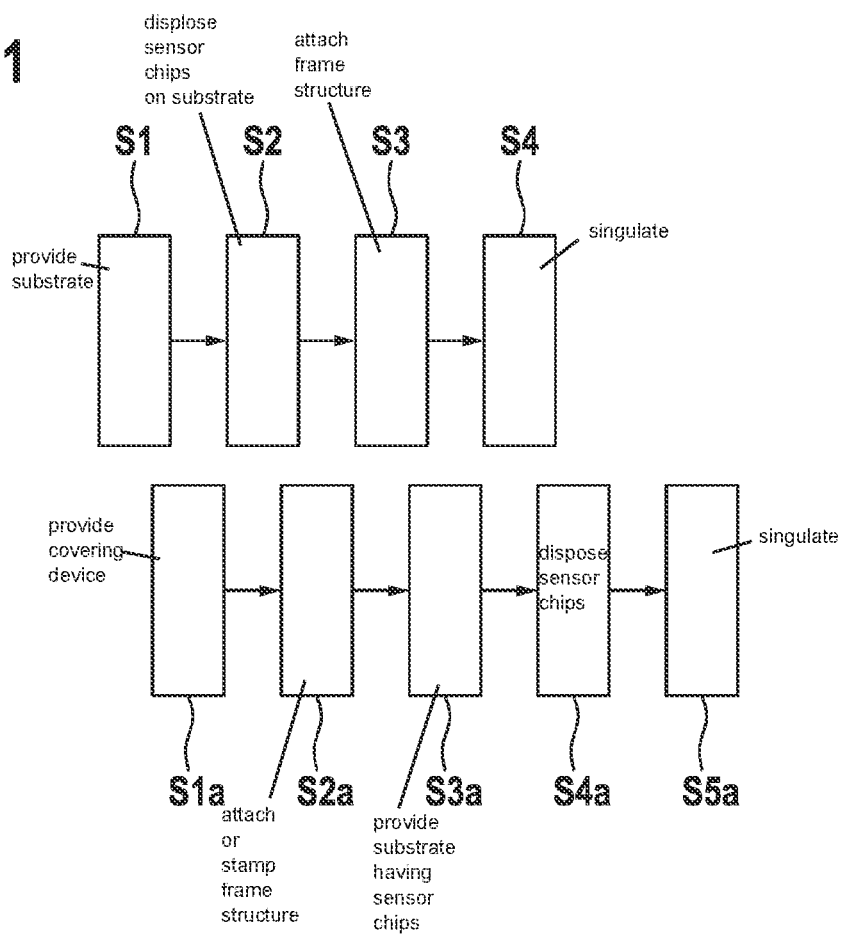
FIG. 11 is a schematic block depiction of a method for producing a plurality of sensor devices, in accordance with an exemplifying embodiment of the present invention.

FIG. 11 is a schematic block depiction of a method for producing a plurality of sensor devices, in accordance with an exemplifying embodiment of the present invention.

In the method for producing a plurality of sensor devices, a substrate having contact points in a plurality of predetermined regions for sensor chips is furnished S1; the sensor chips are disposed S2 in the predetermined regions on the substrate and the sensor chips are electrically contacted to the contact points; a frame structure is attached S3 using an adhesive material to the substrate and between the sensor chips, the frame structure proceeding laterally around the sensor chips, the frame structure extending vertically beyond the sensor chips after attachment and forming a respective cavity for at least one of the sensor chips, and a membrane spanning at least one of the cavities for the sensor chips so as to cover it; and the substrate, or the frame structure and the substrate, are singulated S4 around the respective cavities into several sensor devices.

On the other hand, in the method for producing a plurality of sensor devices: a covering device which spans a holding frame is furnished Sla; a frame structure is attached S2a or stamped onto the covering device, or a frame structure, which describes predetermined regions for sensor chips and surrounds the predetermined regions as a respective cavity, is stamped out of the covering device; a substrate having sensor chips disposed thereon is furnished S3a, a disposition of the sensor chips corresponding to the cavities of the frame structure; the substrate is disposed S4a on the frame structure so that at least one sensor chip is encompassed by one of the cavities, the substrate being adhesively bonded to the frame structure; and the substrate, or the frame structure and the substrate, is singulated S5a around the respective cavities into several sensor devices.

Although the present invention has been described above completely with reference to the preferred exemplifying embodiment, it is not limited thereto but rather is modifiable in many ways.

What is claimed is:

1. A method for producing a plurality of sensor devices, comprising the following steps:
   furnishing a substrate having contact points in a plurality of predetermined regions for sensor chips;
   disposing the sensor chips in the predetermined regions on the substrate, and electrically contacting the sensor chips to the contact points;
   attaching a frame structure with an adhesive material on the substrate and between the sensor chips, the frame structure proceeding laterally around the sensor chips, the frame structure extending, after attachment, vertically beyond the sensor chips and forming respective cavities for the sensor chips, a membrane spanning at least one of the respective cavities for the sensor chips so as to cover the at least one of the cavities; and
   singulating only the substrate around the respective cavities into the plurality of sensor devices.

2. The method as recited in claim 1, wherein the adhesive material is an electrically conductive adhesive material and is attached to the substrate and between the predetermined regions for the sensor chips, and the frame structure is disposed on the adhesive material.

3. The method as recited in claim 1, wherein a carrier cover is disposed on the frame structure so as to at least partly span the cavities, and the membrane is disposed on the carrier cover, the carrier cover encompassing an orifice above at least one of the cavities.

4. The method as recited in claim 3, wherein the membrane is laminated onto the carrier cover.

5. The method as recited in claim 1, wherein the singulation is accomplished by mechanical sawing or by laser ablation.

6. The method as recited in claim 1, wherein the frame structure is disposed as a prefabricated component and in one piece on the substrate.

7. A method for producing a plurality of sensor devices, comprising the following steps:
   furnishing a covering device that spans a holding frame;
   attaching or stamping a frame structure onto the covering device, or stamping out of the covering device the frame structure, the frame structure defining predetermined regions for sensor chips and surrounding the predetermined regions as respective cavities;
   furnishing a substrate having sensor chips disposed thereon, a disposition of the sensor chips on the substrate corresponding to the cavities of the frame structure;
   disposing the substrate on the frame structure in such a way that at least one sensor chip is encompassed by one of the cavities, the substrate being adhesively bonded to the frame structure; and
   singulating only the substrate around the respective cavities into the plurality of sensor devices,
   wherein the covering device spans at least one of the respective cavities for the sensor chips so as to cover the at least one of the cavities.

8. The method as recited in claim 7, wherein before the singulation, a reinforcing tape is furnished on a support, and the frame structure having the covering device is disposed on the reinforcing tape, and singulation is accomplished on the reinforcing tape and on the support, the sensor devices being detached from the reinforcing tape after singulation.

9. The method as recited in claim 7, wherein the frame structure is shaped directly on the covering device using an injection molding method.

10. The method as recited in claim 7, in which the frame structure is disposed as a prefabricated component on the covering device.

11. The method as recited in claim 7, wherein the frame structure is produced on the covering device using a lithography method.

12. The method as recited in claim 7, wherein the frame structure also extends at least locally from side walls of the one of the cavities into an inner region of the one of the cavities, where the frame structure at least partly covers or fills the covering device.

13. The method as recited in claim 7, wherein the frame structure is shaped out of the covering device and at least locally covers the cavities, and constitutes oblique side walls of the cavities.

14. A sensor device, comprising:
   a substrate having contact points and at least one sensor chip contacted to the contact points;
   a frame structure on the substrate which forms a cavity for the sensor chip and extends from the substrate vertically beyond the sensor chip; and
   a covering device disposed on the frame structure and so as to at least partly span the cavity,
   wherein the frame structure is produced from an injection-molded part and the covering device encompasses a microporous membrane.

* * * * *